United States Patent [19] [11] 3,993,800
Callender [45] Nov. 23, 1976

[54] MOUNTING TECHNIQUE FOR THIN FILM SCHOTTKY BARRIER PHOTODIODES

[75] Inventor: Robert E. Callender, Fairfax County, Va.

[73] Assignee: The United States of America as represented by the Secretary of the Army, Washington, D.C.

[22] Filed: Apr. 1, 1975

[21] Appl. No.: 564,178

[52] U.S. Cl. .................................. 427/74; 427/84; 427/87; 427/108; 427/109; 427/124; 427/125; 427/398 R
[51] Int. Cl.² .......................................... B05D 5/12
[58] Field of Search ............... 427/76, 84, 87, 108, 427/124, 125, 109, 91, 89, 55, 398

[56] References Cited
UNITED STATES PATENTS 2,953,621  9/1960  Schultz ............................. 427/76
2,994,621  8/1961  Hugle et al. ....................... 427/87

Primary Examiner—Cameron K. Weiffenbach
Attorney, Agent, or Firm—Nathan Edelberg; Max L. Harwell; Robert P. Gibson

[57] ABSTRACT

A method of mounting thin film photodiodes to a cryogenic cold finger in which the photodiode uses opaque metal Schottky barrier contacts to form the active regions of the photodiode. The method comprises laying a mirrored surface on one side of a radiation transparent substrate with the thin film photodiode on the other side of the substrate and the plurality of metal Schottky barrier contacts on the photodiode. The mirrored side of the substrate is mounted to the cold finger and reflects incoming radiation off the mirrored surface back to the active area of the photodiode.

7 Claims, 4 Drawing Figures

MOUNTING TECHNIQUE FOR THIN FILM SCHOTTKY BARRIER PHOTODIODES

The invention described herein may be manufactured, used, and licensed by or for the Government for governmental purposes without the payment to me of any royalty thereon.

BACKGROUND OF THE INVENTION

The field of this invention is in thin film photodiode fabrication and the method of mounting the photodiode to a cryogenic cold finger used in such a device as thermal imaging systems. At present, thin film photodiodes are in the experimental stage. Even though thin film photodiodes appear to be feasible for use with infrared imaging systems, a problem still exists in the method of mounting a thin film photodiode array on a cryogenic cold finger.

Thin film photodiodes formed by Schottky barrier metal contacts have a disadvantage in that if the metal used to form the Schottky barrier is of sufficient thickness to form a good electrical contact, it will not transmit radiation. Therefore, even though the thick metal used to form the Schottky barrier forms a good electrical contact (i.e. a sensitive photodiode), the thick metal forming the diode may also shield the active area from incoming radiation.

Previously, some semiconductor materials that form photodiodes were grown on transparent substrates and the photodiodes turned away from the radiation source and placed directly on the cold finger with the radiation coming through the transparent substrate. There are many disadvantages to a semiconductor photodiode mounting method such as this on a cold finger. First, the thermal and mechanical bonding is very difficult, resulting in thermal mismatch and damage between the range of room temperatures and the cryogenic temperatures. Such damages can permanently destroy the photodiodes. One electronic lead per photodiode detector must be brought out from under the mounted substrate without shorting or damaging the array of detectors.

SUMMARY OF THE INVENTION

The present mounting method comprises evaporating a mirrored surface on one side of transparent substrate and depositing a thin film photodiode semiconductor layer on the other side of the substrate. An opaque metal Schottky barrier contact, having electrical leads therefrom, is applied to the photodiode to form an active region. The mirrored surface is adhered to a cold finger such that radiation is reflected from the mirrored surface to the active region of the photodiode. The substrate is thick enough that there are matching thermal expansion characteristics between the cold finger and the substrate.

DETAILED DESCRIPTION OF THE PREFERRED EMBODIMENT

Figure 1:
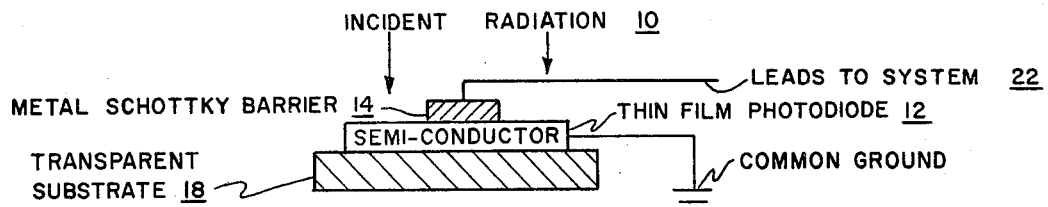
FIG. 1 is a schematic of a conventional Schottky barrier diode array.

FIG. 1 shows a side view of an unmounted Schottky barrier diode in which incident radiation 10 is entering the thin film photodiode semiconductor material 12 from the metal Schottky barrier 14 side of transparent substrate 18. In FIG. 1, the substrate 18 is used as a mounting means for photodiode 12 and barrier 14. However, since incident radiation is applied through the substrate, the substrate material 18 must be made of some material that is reasonably transparent to the radiation 10 incident thereon. Numeral 22 is an electrical lead to the attached system.

Figure 2:
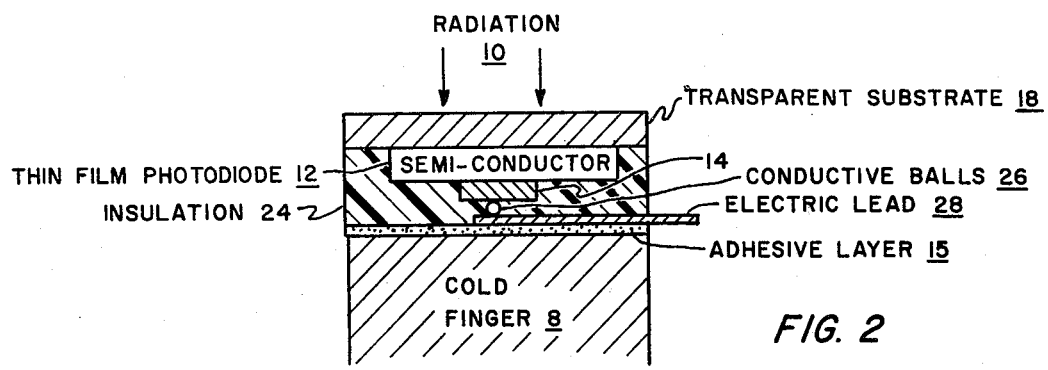
FIG. 2 is a PRIOR ART method of mounting a photodiode on a cryogenic cold finger.

FIG. 2 shows known methods presently used for mounting the photodiode array on a cold finger 8. Even though radiation 10 has the desired perpendicular incidence on the active regions of the photodiode area at the photodiode 12 and metal 14 interface, there are many disadvantages to this mounting method. First, when the photodiode is inverted with the opaque metal Schottky barrier contacts interfacing with the cold finger, additional insulation is needed for mounting rigidity. Second, a plurality of electrical leads 28, representing one per photodiode detector, must be brought out from between the cold finger 8 and the insulation 24. A connecting means, such as a plurality of conductive balls 26, must be used for proper connection of the plurality of electrical leads 28 to the plurality of photodiode detectors. Also, the mechanical bond, or adhesive layer 15, must match almost exactly the thermal expansion characteristics of the insulation 24 and semiconductor material 12.

Figure 3:
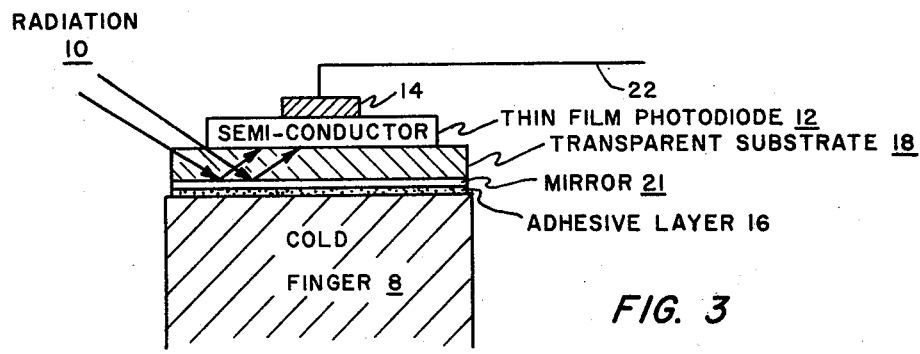
FIG. 3 is one embodiment of the present method of mounting a photodiode on a cold finger.
Figure 4:
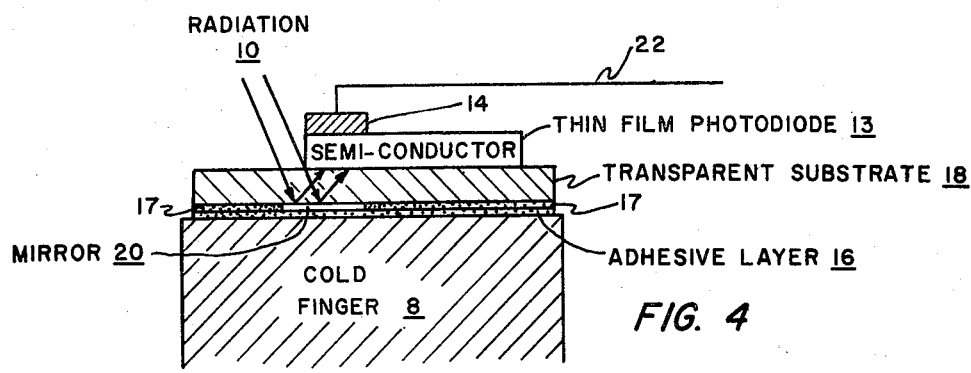
FIG. 4 is a second embodiment of the present method of mounting a photodiode on a cold finger.

Refer now to FIGS. 3 and 4 for two of the present means of fabricating thin film photodiodes and methods of mounting the thin film photodiodes on a cryogenic cold finger 8. In FIG. 3, a mirrored surface 21 is contiguous with one side of transparent substrate 18. Substrate 18 may be made of a layer of barium fluoride about ⅛ inch thick. The mirrored surface 21 is preferably evaporated on substrate 18 in a vacuum environment. Materials used for the mirrored surface may be consecutive layers of chrome and gold. On the side of substrate 18 opposite mirrored surface 21, a layer of thin film photodiode material 12 is deposited. Typical materials 12 are lead telluride or lead tin telluride films that are from 1 micrometer to 10 micrometers thick. A plurality of opaque metal Schottky barrier contacts are deposited on the photodiode material 12. A plurality of electrical leads 22, attached to the contacts, are connected back to an infrared imaging system processing electronics (not shown). The opaque metal Schottky barrier contacts and the electrical leads are easily accessible for bonding techniques. The mirrored surface 21 is attached to cold finger 8 by various means, such as being epoxied, soldered, welded, clamped, etc. The attachment is represented by adhesive layer 16. Any vacuum compatible adhesive may be used since the substrate 18 protects the photodiode material 12. The ⅛ inch thick substrate 18 is thick enough to absorb thermal expansion characteristics of the cold finger. Radiation 10 incident on mirror 21 is back reflected through the transparent substrate 18 into the thin film photodiode material 12. Material 12 must be thin enough to allow the minority carriers generated by the absorbed radiation 10 to reach the active area of the photodiode, formed by the contact of the opaque metal 14 and the thin film photodiode semiconductor 12.

Operation of the photodiode active area detectors are as follows. At the rectifying junction where the active region is formed, a region free of mobile carriers is formed (called a depletion region) due to the electric field set up by the energy level mismatch. When infrared radiation 10 impinges on the film 12, some of the radiation is adsorbed. The adsorption process generates a hole and electron pair in film 12. Note that one photon of light energy generates a hole-electron pair. The electric field in the depletion region separate, the hole-electron pair and they are accelerated in opposite directions. Their generation, movement and eventual recombination create a current flow called the photocurrent. This constitutes the photoresponse of the Schottky barrier contact.

FIG. 4 illustrates slight changes from the embodiment of FIG. 3. The thin film photodiode semiconductor material 13 only goes to one edge of the opaque metal 14, and mirror 20 is a narrow strip no wider than the active area detector length divided by the cosine of the reflected angle. Mirror 20 may be in adhesive layer 16, or in a second adhesive layer 17. The more direct incidence of radiation 10 in FIG. 4 decreases the possibility of internal reflection in the substrate 18.

Obviously many modifications and variations of the present invention are possible in the light of the above teachings. It is therefore to be understood that within the scope of the appended claims the invention may be practiced otherwise than as specifically described.

I claim:

1. A mounting method for providing thermal compatability between a thin film photodiode and a cryogenic cold finger comprising the steps of:

providing a ⅛ inch thick barium fluoride substrate transparent to infrared radiation;

evaporating in a vacuum environment a mirrored surface comprised of consecutive layers of chrome and gold on one side of said substrate;

depositing a layer of thin film photodiode material on a second side of said substrate that is opposite said mirrored surface;

depositing a plurality of opaque metal Schottky barrier contacts on said photodiode material to form a plurality of photodiodes between said layer of thin film photodiode material and said Schottky barrier contacts;

bonding a plurality of electrical leads to said plurality of said barrier contacts wherein said plurality of electrical leads are connected to an infrared imaging system;

providing a cryogenic cold finger;

attaching said mirrored surface to said cold finger by providing a vacuum compatible adhesive layer therebetween wherein said ⅛ inch thick barium fluoride substrate is large enough to be thermally compatible with said cryogenic cold finger; and irridiating said mirrored surface with infrared radiation whereby said mirrored surface back reflects said infrared radiation through said substrate into said layer of thin film photodiode material for creating photocurrent at said plurality of photodiodes.

2. A mounting method as set forth in claim 1 wherein the said two steps of evaporating a mirrored surface on one side of said substrate and attaching said mirrored surface to said cold finger by providing a vacuum compatible adhesive therebetween are replaced by the step of:

providing a mirrored surface comprised of a strip of consecutive layers of chrome and gold in an adhesive layer wherein one side of said substrate is attached by said adhesive layer to said cryogenic cold finger in which said substrate only goes to one edge of said Schottky barrier contacts that form said photodiodes whereby the strip of mirrored surface is no wider than the length of said photodiodes divided by the cosine of reflected radiation incident on said mirrored surface.

3. A mounting method as set forth in claim 1 wherein said mirrored surface is contiguous with the entire surface of said one side of said substrate.

4. A mounting method as set forth in claim 1 wherein said thin film photodiode material is lead telluride.

5. A mounting method as set forth in claim 4 wherein said lead telluride is between 1 and 10 micrometers thick.

6. A mounting method as set forth in claim 1 wherein said thin film photodiode material is lead tin telluride.

7. A mounting method as set forth in claim 6 wherein said lead tin telluride is between 1 and 10 micrometers thick.

* * * * *